United States Patent

Callahan, Jr.

[15] 3,673,508

[45] June 27, 1972

[54] SOLID STATE OPERATIONAL AMPLIFIER

[72] Inventor: Michael J. Callahan, Jr., Dallas, Tex.

[73] Assignee: Texas Instruments Incorporated, Dallas, Tex.

[22] Filed: Aug. 10, 1970

[21] Appl. No.: 62,461

[52] U.S. Cl. ..................................330/30 D, 330/17, 330/20

[51] Int. Cl. ..................................H03f 3/68

[58] Field of Search ..................................330/30 D, 69

[56] References Cited

UNITED STATES PATENTS

| | | | |
|---|---|---|---|
| 3,500,223 | 3/1970 | Thurnell | 330/30 D |
| 3,530,395 | 9/1970 | Prusha | 330/69 |
| 3,480,872 | 11/1969 | Brever | 330/30 D |
| 3,553,492 | 1/1971 | Bugay | 330/30 D |
| 3,421,020 | 1/1969 | Ringelhaan | 330/30 D |

*Primary Examiner*—Nathan Kaufman
*Attorney*—James O. Dixon, Andrew M. Hassell, Harold Levine, Mel Sharp, John E. Vandigriff, Henry T. Olsen and Michael A. Sileo, Jr.

[57] ABSTRACT

A low input current, high response rate solid state operational amplifier is provided by coupling low input current emitter follower circuits to the inputs of a differential amplifier circuit which has been gain stabilized by the use of multiple collector transistors and current feedback.

12 Claims, 8 Drawing Figures

INVENTOR
Michael J. Callahan, Jr.
BY Michael A. Sileo, Jr.
ATTORNEY
James B. Hinson
WITNESS

SOLID STATE OPERATIONAL AMPLIFIER

BRIEF DESCRIPTION OF INVENTION AND BACKGROUND INFORMATION

This invention relates to solid state amplifiers and, more particularly, to solid state integrated circuit operational amplifiers.

The design of solid state operational amplifiers presents many unique and difficult problems. This is particularly true when it is desired to use bi-polar transistors. Many of the problems are traceable to the inherent mismatch between two similar transistors and the variations in individual transistor characteristics with temperature. Further complications are introduced in integrated circuits due to the fact that most integrated circuit transistors have relatively low gain.

The inherent low gain of the bi-polar transistors in integrated circuits has required that prior art operational amplifiers either operate such that the first voltage amplification stage has either a high input base current or low collector current. High base current to the input transistor required that the signal source coupled to the input of the amplifier be capable of supplying this current since the signal source current and the base current to the input transistor are essentially the same. Alternatively, the base current can be reduced with a corresponding reduction in the collector current, however, this requires the use of larger collector resistors and limits the speed of response or slew rate of the amplifier because of the low current available to charge any capacitance which may be associated with the following stages. As a result of these problems, prior art operational amplifier have either had relatively low speed of response or required high input currents.

This invention advantageously solves the above-discussed problems by providing a solid state integrated circuit operational amplifier in which the input current is low and the slew rate is high, slew rate being the rate at which the output changes in response to a step change in the input signal. This improved operation is provided by emitter follower input circuits coupled to a stabilized differential amplifier stage. The emitter followers provide high speed operation even though the collector and emitter currents and the input base current are low because an emitter follower has high current gain and low output impedance; therefore, it can rapidly charge or discharge any capacitance associated with circuits coupled to its output. The differential amplifier stage is gain stabilized for variations in transistor characteristics through the use of matched resistors in the emitter circuits of the two transistors comprising the differential stage and by current feedback loops through one collector of the multi-collector transistor circuits. The theory of stabilizing amplifiers through the use of feedback loops and multi-collector transistors will be discussed in detail later.

Other embodiments of the invention provide improved biasing arrangements whereby the emitter follower input circuits and the differential amplifier are supplied with constant bias current through separate constant current sources and circuitry to protect the input transistors during periods of high differential input signal and differential output circuitry.

The above-discussed amplifier advantageously solves many of the problems associated with prior art amplifiers, especially when it is desired to have high response rates while requiring only low input currents.

One object of this invention is to provide a solid state integrated circuit operational amplifier requiring low input currents and having a high slew rate.

Another object of the invention is to provide an operational amplifier having bi-polar input transistors and requiring low input current.

Another object of the invention is to provide an integrated circuit operational amplifier tolerant to high differential input signals.

These and other objects of the invention will be obvious to those skilled in the art in view of the attached drawings and detailed description of preferred embodiments.

DETAILED DESCRIPTION

Each of the embodiments of this invention are comprised of a plurality of transistors which are interconnected to each other and other circuit components to form an amplifier stage. The following description of the salient characteristics of these transistors and associated circuits will greatly simplify the detailed discussion of the preferred embodiments and aid in the understanding of the circuits.

Figure 5:
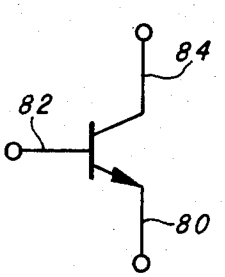
FIG. 5 is a schematic diagram of a transistor.

FIG. 5 shows a schematic diagram of a single transistor of the type used in the embodiments of this invention. Each of these transistors are three-terminal devices with the terminals referred to as the emitter 80, the base 82, and the collector 84. Each transistor is a current amplifier; a small current applied to the base lead 82 causes a much larger current to flow in the emitter and collector leads 80 and 84. In magnitude, the emitter current is equal to the summation of the base and collector current and the collector current is equal to the emitter current less the base current. The ratio of the base current to the collector current is commonly referred to as the current gain of the transistor.

Figure 6:
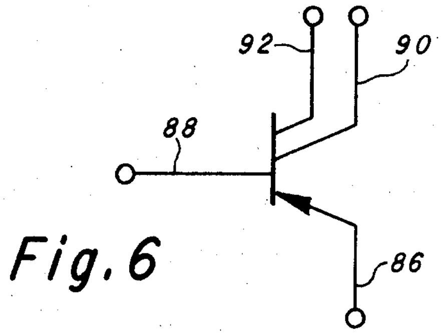
FIG. 6 is a schematic diagram of a multiple-collector transistor.

FIG. 6 is a schematic diagram of a multiple collector transistor. This transistor is a four lead device, having an emitter terminal 86, base terminal 88, and two collector terminals 90 and 92. As previously discussed in reference to FIG. 5, this transistor is a current amplifier in that a small current applied to the base terminal causes a much larger current to flow in the emitter and collector terminals. The emitter current of this device will be equal to the sum of the base and collector currents. The total collector current will divide between the two collector terminals 90 and 92 with the ratio determined by the internal geometry of the transistor.

Figure 7:
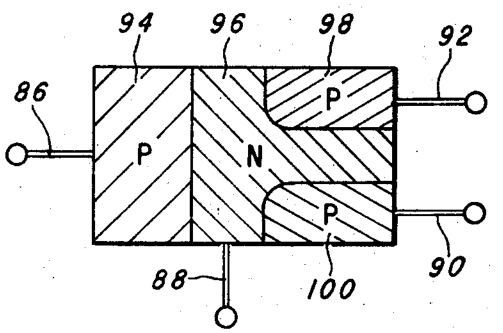
FIG. 7 is a simplified diagram showing the general internal structure of a multiple-collector transistor.

FIG. 7 is a simplified drawing to illustrate the principle of construction of a multiple collector transistor of the type shown schematically in FIG. 6. The semiconductor chip in which the transistor is formed is divided into four regions. The emitter region 94 is a region of P-conductivity type while the base region 96 is a region of N-conductivity type and the collector regions 98 and 100 are of P-conductivity type. The collector regions 98 and 100 are electrically isolated from each other by a portion of the base region 96. As in conventional transistors, the base region, in conjunction with the emitter region, forms one P-N junction while the base, in conjunction with the collector region, forms another P-N junction. As above-discussed in reference to FIG. 6, a small current applied to any base terminal 88 causes a much larger current to flow in the emitter 86 and the collectors 90 and 92. The emitter current is equal to the summation of the base and collector currents with the collector current dividing between the two collector terminals 90 and 92 in direct ratio to the areas of the P-N junctions formed by the respective collector regions 98 and 100 with the base region 96. By proper choice of the transistor geometry, the ratio of currents flowing in the two collector leads 90 and 92 can be controlled with a high degree of accuracy. For example, the current in collector lead 90 can be made to be five times the current in collector lead 92.

Figure 8:
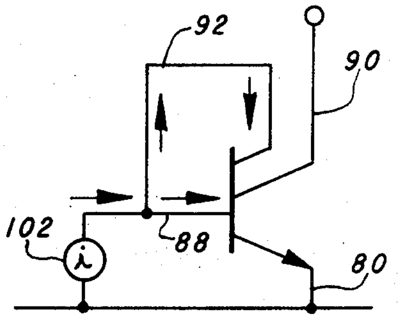
FIG. 8 is a schematic diagram indicating how one collector of a multiple-collector of a transistor can be connected to the base lead in order to stabilize the apparent current gain of the transistor.

FIG. 8 is a schematic diagram illustrating how current feedback can be used in multi-collector transistors to stabilize apparent current gain. The collector terminal 92 has been returned to the base terminal 88 and a signal current source 102 is coupled to the base terminal 88 of the transistor. In this configuration, the current flowing in the input current source 102 must be equal to the sum of the current flowing in base terminal 88 and collector terminal 92. Assuming that the current gain of the transistor is 100 and the collector regions 90 and 92 are chosen such that collector terminal 92 will have 20 milliamperes of current flowing while collector terminal 90 has 80 milliamperes of current flowing, then the base current of the transistor will be 1 milliampere. Under these circumstances, the current flowing in the input current source 102 will be 21 milliamperes and the current flowing in the collector terminal 90 will be 80 milliamperes. Since a large percentage of the current flowing in the input current source 102 is a result of the feedback current from collector terminal 92, and the ratio of the feedback current to the current flowing in collector terminal 90 is determined by the geometry of the transistor, it can easily be seen that the current gain of this configuration is approximately 4 and is essentially determined by the relative size of the two collector regions.

Figure 1:
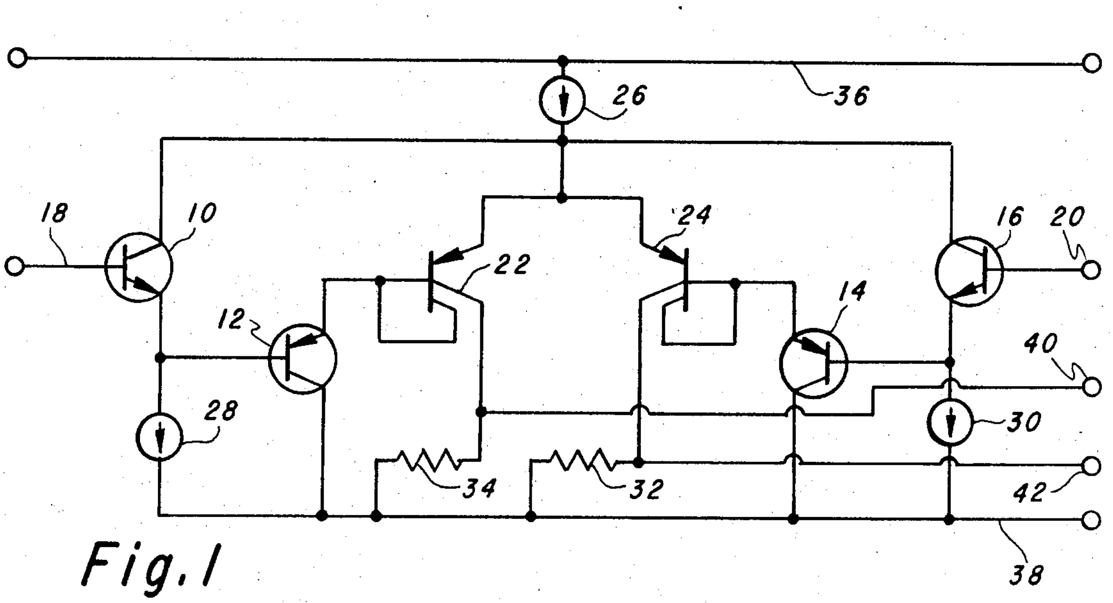
FIG. 1 is a schematic diagram of one embodiment of this invention in which differential inputs and outputs are provided.

Referring to FIG. 1, two transistors, 10 and 12, are interconnected to form one emitter follower input circuit while two other transistors, 14 and 16, are interconnected to form a second emitter follower input circuit. These input circuits are, in turn, connected to the base terminals of two multiple-collector transistors 22 and 24 which comprise a differential voltage amplifier stage. The emitters of the transistors 10 and 16 are respectively interconnected with matched current sources 28 and 30 to supply these transistors with emitter current. The differential amplifier stage, comprising transistors 22 and 24, is supplied with bias current from a current source 26. Power is supplied to the entire stage by positive and negative voltage sources, not shown, with the positive voltage source connected to buss 36 while the negative voltage source is connected to buss 38. Two load resistors, 32 and 34, one in each of the collector circuits of the transistors 22 and 24, are coupled to the output terminals 40 and 42 thereby providing a differential output circuit while the base terminals of the input transistors 10 and 16 are coupled to the input terminals 18 and 20 thereby providing a differential input circuit.

Figure 2:
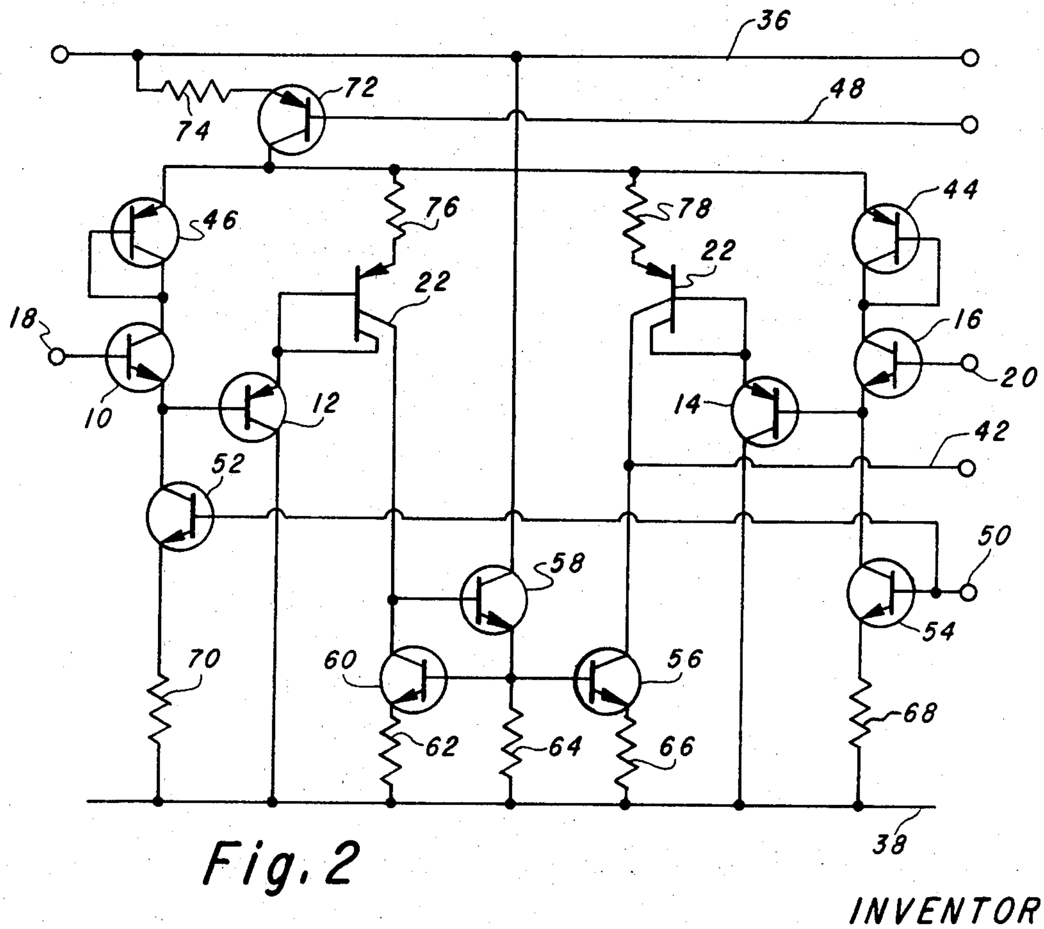
FIG. 2 is a schematic diagram of another embodiment of this invention which provides differential input terminals and a single-ended output circuit.

FIG. 2 is a second embodiment of this invention having a differential input and a single-ended output and includes detail circuitry for the current sources supplying current to the emitter follower input stages and the inverting differential amplifier. Additionally, the collector circuits of the emitter follower input transistors 10 and 16 include two transistors 44 and 46, which are connected as diodes. These diodes increase the differential voltage which can be applied between the input signal terminals 18 and 20 before voltage breakdown occurs. Three transistors, 56, 58 and 60, in conjunction with three resistors, 62, 64 and 66, form a coupling network replacing the differential amplifier load resistors 32 and 34 of FIG. 1 and combine the differential output signal, available at the collectors of the two transistors 22 and 24, into a single-ended output signal which is available at the output terminal 42. The symmetrical nature of the network also contributes to the overall stability of the circuit. For example, any changes in transistor 56 due to environmental factors will be counteracted by similar changes in transistor 60.

Bias is provided to the circuit by three current sources. Current is provided to the input transistors 10 and 16 and the differential amplifier stage by a constant current source consisting of a transistor 72 in conjunction with a fixed emitter resistor 74 and a constant bias voltage, not shown, coupled to the base terminal 48 of the transistor. Two other similar current sources serve as emitter loads for the input transistors 10 and 16. These circuits consist of two transistors 52 and 54, each having an emitter resistor, 70 and 68, respectively, with their base terminals coupled in common and to a common bias voltage terminal 50. The magnitude of the current supplied by these sources is adjusted to the proper value by changing the voltage coupled to the bias input terminals 48 and 50. The exact value of bias voltage will depend on the transistors and resistors used in the circuit, but all amplifiers of the same design require the same bias signals. Preferably, these bias voltages are provided by appropriate voltage divider networks connected between the ground lead 38 and the voltage supply lead 36.

Figure 3:
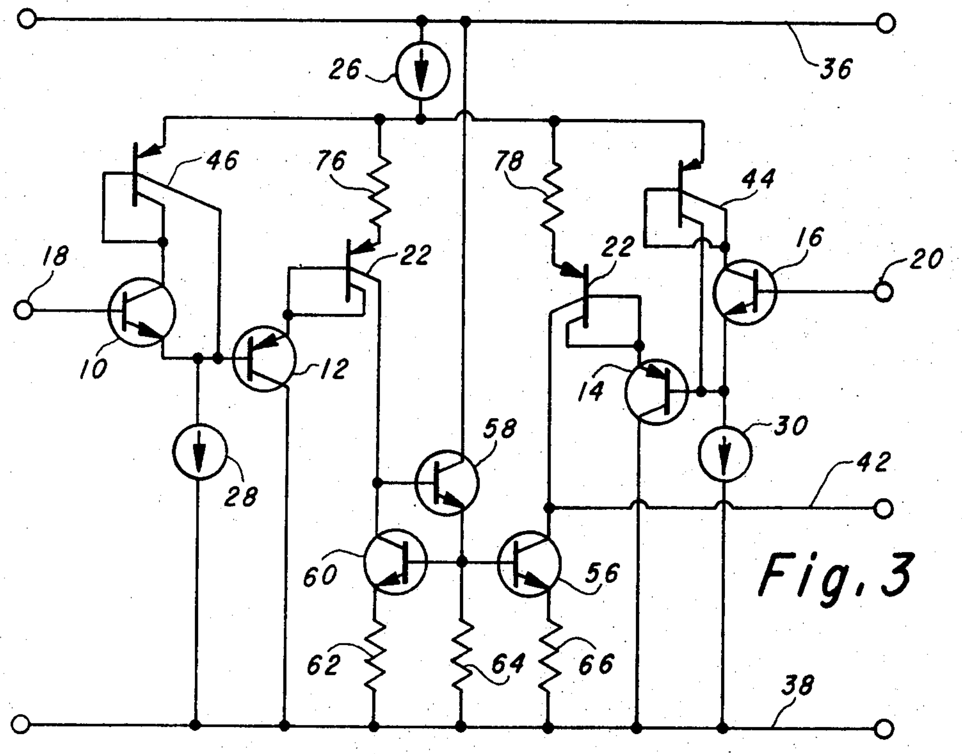
FIG. 3 is an embodiment of the invention including constant current sources for biasing the input transistors.

FIG. 3 is another embodiment of the invention which permits the current sources for the emitter follower input stages to be higher and thus easier to adjust. In this embodiment, the diode connected transistors 44 and 46 have each been replaced by multiple-collector transistors. This permits the current sources 28 and 30 to be set at a higher value because the current provided by these sources is the summation of the currents in the two collectors of the transistors 44 and 46, while the collector current of the input transistors 10 and 16 is respectively provided by one of the collectors of transistors 44 and 46. The ratio of collector currents in these transistors can be determined very accurately, based on the geometry of the transistor as discussed above in reference to FIG. 8. This simplifies the design of the current sources 28 and 30 which are used as load impedances for the input transistors because at higher current levels it is easier to build matched current sources.

Figure 4:
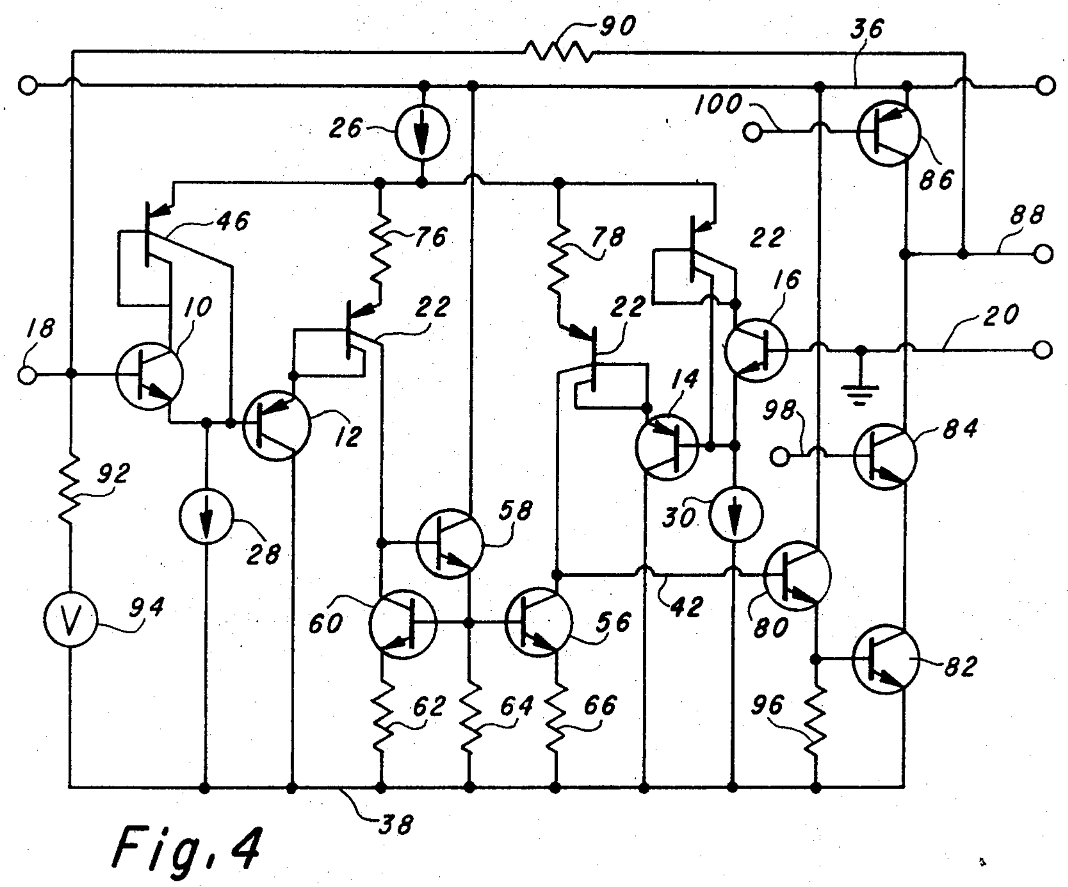
FIG. 4 is a schematic diagram of a solid state operational amplifier including input and feedback resistors for stabilizing the gain.

FIG. 4 is a schematic diagram of an operational amplifier with very accurate and stable gain. Included, in addition to all the circuitry discussed above with reference to FIG. 3, is a power amplifier coupled to the output of the different amplifier. Included in the power amplifier is an output stage consisting of two NPN and one PNP transistor cascode connected. One of the NPN transistors 82 has its base terminal coupled to the output of an emitter follower circuit composed of an NPN transistor 80 and a resistor 96 and its collector coupled to the emitter of a second NPN transistor 84. The base terminal 98 of the second NPN transistor is coupled to a bias source while its collector is coupled to the collector of a PNP transistor 86. The junction formed by connecting the collectors of the NPN and PNP transistors 84 and 86 together forms an output terminal 88. Coupling the emitter of the PNP transistor 86 to the positive voltage supply buss 36 and its base terminal 100 to a bias source completes the output stage. Coupling the base terminal of the emitter follower transistor 80 to the output terminal of the differential amplifier 42 completes the basic amplifier circuit.

The gain of the amplifier is stabilized by a feedback resistor 90 and an input resistor 92 while the non-inverting input terminal 20 is connected to circuit ground. As any elementary textbook on electronics will show, this results in a circuit in which the relationship between the input voltage 94 and the voltage at the output terminal 88 is stable and essentially determined by the ratio of the feedback resistor 90 to the input resistor 92 provided the gain of the amplifier circuit is high. Since the circuitry of FIG. 4 can easily be made to have a gain of 10,000 or more, there is no difficulty in meeting this basic criteria; therefore, the circuitry of FIG. 4 illustrates an amplifier whose gain is determined by the ratio of two resistors. Resistors, and particularly resistor ratios, can be made very accurately and therefore this circuit is useful in applications requiring accurate and stable gain.

Although the preceding embodiments have been discussed without any reference being made to the characteristics of the individual transistors, the biasing arrangement for the input transistors 10 and 16 permits these transistors to operate with near zero collector to base voltage, thereby allowing these transistors to be the so-called "punch through transistors." These transistors are advantageous in that they can have current gains of 1,000 or greater; this results in an order of magnitude reduction in the input current for a given collector current requirement. Additionally, the low collector to base voltage reduces the input leakage current.

The present invention has been described and defined in detail and illustrated in preferred embodiments. It will be apparent, therefore, to one skilled in the arts herein encompassed, that many changes and modifications are possible within the ordinary skill of such artisans without departing from the spirit and the contemplated scope of the invention described, defined, and illustrated herein.

What is claimed is:

1. A solid state amplifier system having a differential output comprising in combination:

a. first and second emitter follower input circuits having their input electrodes respectively coupled to first and second input terminals of the amplifier system;

b. first and second multiple collector transistors having
   1. their emitter electrodes coupled to a first voltage source;
   2. one of their collector electrodes coupled to a second voltage source through a respective output load circuit;
   3. another of their collector electrodes coupled back to their respective base electrode to form a current feedback loop therefor; and
   4. their base electrodes respectively coupled to the output terminal of said first and second input circuits, said multiple transistor circuits forming a differential voltage stage of said amplifier system; and c. first and second output terminals respectively coupled across said output load circuits, thereby providing an amplifier system having a differential output.

2. The amplifier system of claim 1 and further including first and second substantially matched constant current sources respectively coupled to said first and second emitter follower input circuits for supplying emitter biasing currents thereto.

3. The amplifier system of claim 1 and further including a constant current source coupled to the emitter electrodes of said first and second multiple collector transistors for supplying emitter biasing currents thereto.

4. The amplifier system of claim 1 wherein said output load circuits respectively include first and second load resistors respectively coupled between the one collector electrode of said first and second multiple collector transistors and said second voltage source.

5. The amplifier system of claim 1 wherein said output load circuits respectively include first and second series connected resistor and transistor circuit respectively connected between the one collector electrode of said first and second multiple collector transistors and said second voltage source, and further includes a third series-connected resistor and transistor circuit coupled between said first and second voltage sources, wherein the input terminals of the transistors of said first and second series connected resistor and transistor circuits are coupled to the common junction of said third series connected resistor and transistor circuit, and wherein the input terminal of said third series connected resistor and transistor circuit is coupled to said first output terminal for combining the output signals produced by said differential voltage stage, whereby the output signal on said second output terminal is a single-ended output signal.

6. The amplifier system of claim 1 and further includes first and second overvoltage signal protection circuits respectively coupled between said first and second emitter follower input circuits and said first voltage source.

7. The amplifier system of claim 6 wherein said overvoltage signal protection circuits each include a transistor connected as a diode.

8. The amplifier system of claim 6 wherein said overvoltage signal protection circuits respectively include second and third multiple collector transistors.

9. The amplifier system of claim 1 wherein said first and second emitter follower circuits include two transistors connected in an emitter follower configuration.

10. The amplifier system of claim 2 wherein said first and second constant current sources include a series connected resistor and transistor circuit respectively coupled between said first and second emitter follower input circuits and said second voltage source, with the base terminal of the transistor thereof being coupled to third voltage source.

11. The amplifier system of claim 3 wherein said third constant current source includes a series connected resistor and transistor circuit coupled between said first voltage source and said differential amplifier stage.

12. The amplifier system of claim 5 and further including a power amplifier coupled to said second output terminal for providing a substantially accurate and relatively stable operational amplifier.

* * * * *